United States Patent [19]

Petersen

[11] Patent Number: 5,562,470
[45] Date of Patent: Oct. 8, 1996

[54] CAM ACTUATED SOCKET FOR GULL WING DEVICE

[75] Inventor: Kurt H. Petersen, Austin, Tex.

[73] Assignee: Minnesota Mining and Manufacturing Company, St. Paul, Minn.

[21] Appl. No.: 495,178

[22] Filed: Jun. 27, 1995

[51] Int. Cl.⁶ ................................................. H01R 13/15
[52] U.S. Cl. ............................ 439/259; 439/526; 439/68
[58] Field of Search ................................. 439/259, 260, 439/261, 262, 263, 264, 330, 331, 525, 526, 68

[56] References Cited

U.S. PATENT DOCUMENTS

| | | | |
|---|---|---|---|
| 4,176,895 | 12/1979 | Aldridge | 339/17 |
| 4,341,433 | 7/1982 | Cherian et al. | 339/176 |
| 4,376,560 | 3/1983 | Olsson et al. | 339/17 |
| 4,553,805 | 11/1985 | Aikens | 339/75 |
| 4,630,875 | 12/1986 | Korsunsky et al. | 339/17 |
| 4,758,176 | 7/1988 | Abe et al. | 439/331 |
| 4,846,703 | 7/1989 | Matsuoka et al. | 439/71 |
| 4,872,850 | 10/1989 | Mogi et al. | 439/264 |
| 4,986,760 | 1/1991 | Petersen et al. | 439/71 |
| 5,159,266 | 10/1992 | Appold | 439/259 |
| 5,195,903 | 3/1993 | Uratsuji | 439/331 |
| 5,288,240 | 2/1994 | Savant | 439/266 |

*Primary Examiner*—David L. Pirlot
*Assistant Examiner*—Yong Kim
*Attorney, Agent, or Firm*—Gary L. Griswold; Walter N. Kirn; Darla P. Neaveill

[57] ABSTRACT

A socket for temporary contact to a gull wing type electronic device includes a cylindrical cam having a recess and a surface adjacent the recess for bearing against leads of the gull wing device upon rotation of the cam and forcing the leads into engagement with contacts providing electrical contact between the leads and another electronic device.

4 Claims, 4 Drawing Sheets

5,562,470

CAM ACTUATED SOCKET FOR GULL WING DEVICE

FIELD OF THE INVENTION

The present invention relates generally to sockets for electronic devices and, more particularly, to sockets for gull wing packaged electronic circuits.

BACKGROUND OF THE INVENTION

Many presently popular electronic devices are packaged in a plastic molded body with leads formed in a "gull wing" shape. That is, the leads emerge from the body of the device along the edge(s) at the parting line of the molded body. The leads are subsequently formed downward and then outwardly at a point beyond the lower plane of the body. The original intent of this lead form was to allow soldering of the leads in two or four sided devices to a planer circuit board. Leads may emerge from one, two, or four sides of the device. In circuit application which require the device to be removable, a socket is required.

Several sockets have been developed to provide this function. One previous method for applying contact force to the leads has involved a pressure pad which is centrally mounted to a hinged cover. The device is mounted and the cover latched at an edge opposite the hinge, holding the pressure pad so that it applies force to the tops of the outward formed leads of the electronic device. This force depresses resilient contacts which are located under the device leads. The force to operate this system is supplied when the cover is closed. The latch and hinge maintain the force against the depressed contacts. Sockets of this type are typically used in burn-in applications.

Another type of socket has a removable carrier that surrounds the device and provides a surface in direct contact with the top of the outward formed portion of the lead. The carrier, with the retained device, is placed into the body of the socket and pressed until latches can be closed. These latches retain the force of the contacts against the bottom of the leads. This type of socket is primarily used in OEM applications.

SUMMARY OF THE INVENTION

The present invention is useful for burn-in of electronic gull wing packages which require vertical actuation, and for mounting these devices in space sensitive OEM applications which require that the device be removable.

The socket of the invention uses a rotating cam or cams located on an axis substantially in the same horizontal plane as the tips of the device leads and offset from the tips. Each cam has one section consisting of a minor radius that extends approximately ¼ to ¾ around the circumference, and a major radius for the balance of the circumference. In one embodiment of the invention, the minor radius has additional ribs to insure separation of and to locate the leads of the gull-wing device. In this implementation of the invention the contact has a profile, with a surface at the interface with the cam matching the minor radius of the cam, and also a contacting surface matching the lower angle of the device leads. The cam is suitably mounted in a location such that the minor radius surface is outside the ends of the leads and the arc of the major radius surface interferes with the lead. When the cam is rotated to the open condition, the device lead has access from the vertical direction. The device may be lowered until the leads comes to rest on the tops of the contacts. Each individual lead and a matching contact are both within the same slot formed by the previously mentioned ribs of the cam. The cam transition surface from the minor radius to the major radius is along a substantially radial plane through the axis of rotation. When the cam is rotated toward the lead, the transition surface will strike the top surface of the lead. Additional cam rotation will provide force to the top of the lead which will resiliently compress the contact against its own spring force. One end of the cam has a lever cantilever arm used to decrease the required operating torque to a level which is comfortable but yet provides the contacting pressure necessary for a reliable contact interface. In this implementation of the invention the end of the cantilever arm is retained under a stationary hook latch molded on the socket body.

BRIEF DESCRIPTION OF THE DRAWINGS

The present invention will be described with respect to the accompanying drawings, wherein like numbers refer to like parts in the several views, and wherein.

DESCRIPTION OF THE PREFERRED EMBODIMENT

Figure 1:
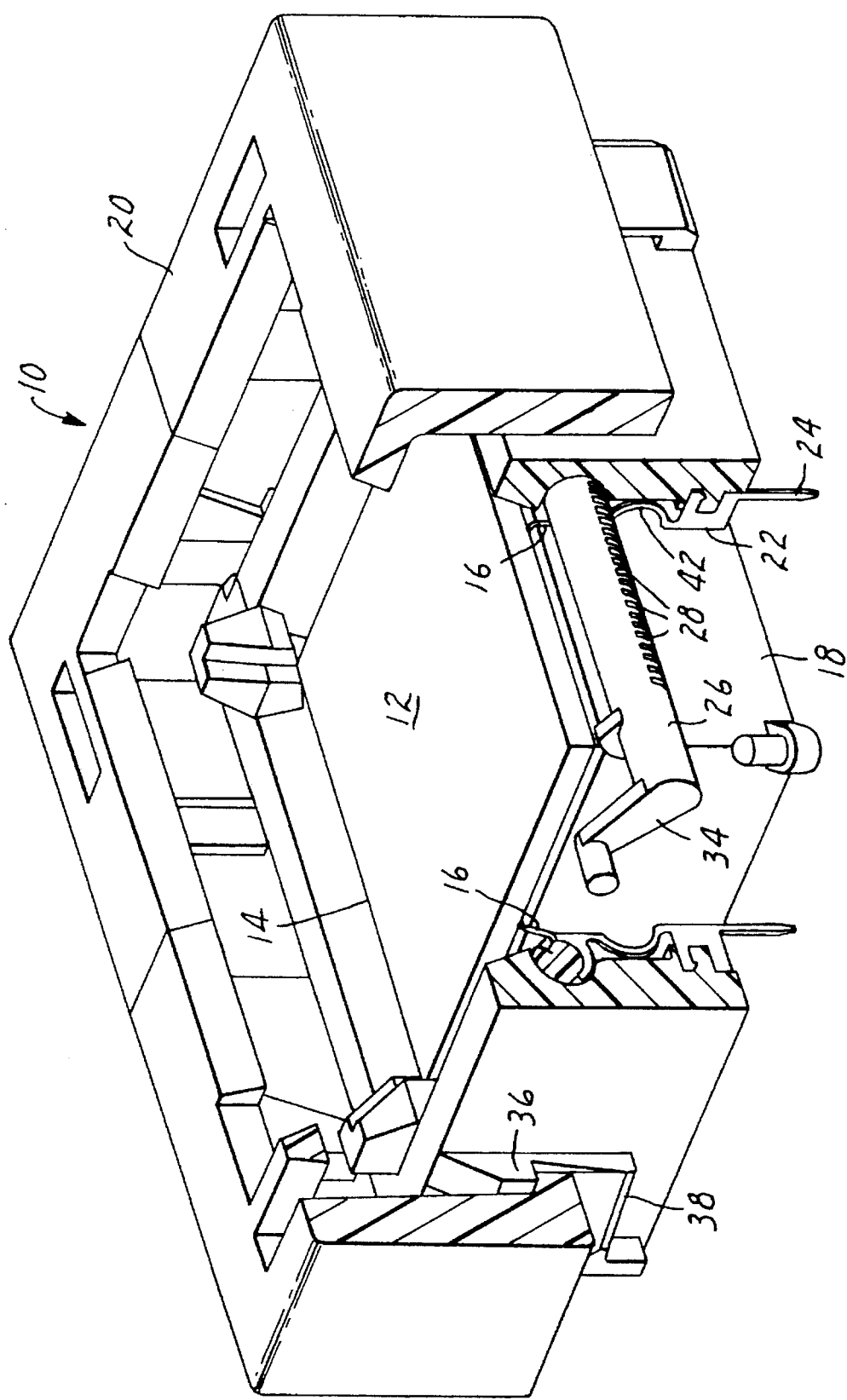
FIG. 1 is a perspective view, with portions in cross-section, of a first embodiment of a socket according to the present invention.

FIG. 1 illustrates a socket, generally indicated as 10, which is designed for use with electronic devices of the gull wing type 12 wherein an integrated circuit is encapsulated in a flat, square molded plastic body 14. The integrated circuit is connected to other electronic devices by a number of leads 16 which extend outwardly of one or more sides of the molded plastic body 14. These leads terminate in ends which extend parallel to the plane of the body 14 and below the lower surface of the body 14. The socket 10 is designed to temporarily, or at least removably, make connection to the leads 16 of the gull wing device 12 and another electronic device such as a computer (not shown).

The socket 10 includes a base 18 and a cover 20 which is moveable in the vertical direction relative to the base 18. FIG. 1 illustrates the cover 20 in the up and open position wherein the gull wing device 12 is released and may be removed from the socket, or a device 12 inserted in the socket 10 if one is not present. The base 18 and the cover 20 are molded from any of a variety of polymers which exhibit stability and heat tolerance if the socket 10 is to be used in a high temperature environment, such as is encountered if the socket is used for burn-in testing of gull wing devices 12.

Located within the base 18 is a number of contacts 22 correspond to the leads 16 of the device 12. These contacts 22 are for making electrical contact with the leads 16 of the device 12 and conducting signals from the device 12 to another electronic device by means of tails 24 which may be soldered to a circuit board (not shown). Also within the base 18 are cams 26 which include slots 28 cut to correspond to and accept the contacts 22. The cam 26 is generally cylindrical and the slots 28 are cut with a radius smaller than that of the cam 26 outer radius. The slots 28 terminate in flat transition surfaces 30 and 32 along radii of the cam 26, as best seen in FIGS. 2 and 3.

The cams 26 may be rotated by means of an arm 34 disposed at the end of the cam 26. This arm 34 is contacted by the cover 20 and is in the up, open position (FIG. 1 and 2) when the cover 20 is at a distance from the base 18 and in the closed position (FIG. 3) when the cover 20 is depressed. The cover 20 includes detents 36 to prevent the cover 20 from being separated from the base 18 and notches 38 which retain the cover 20 in the closed position.

Figure 2:
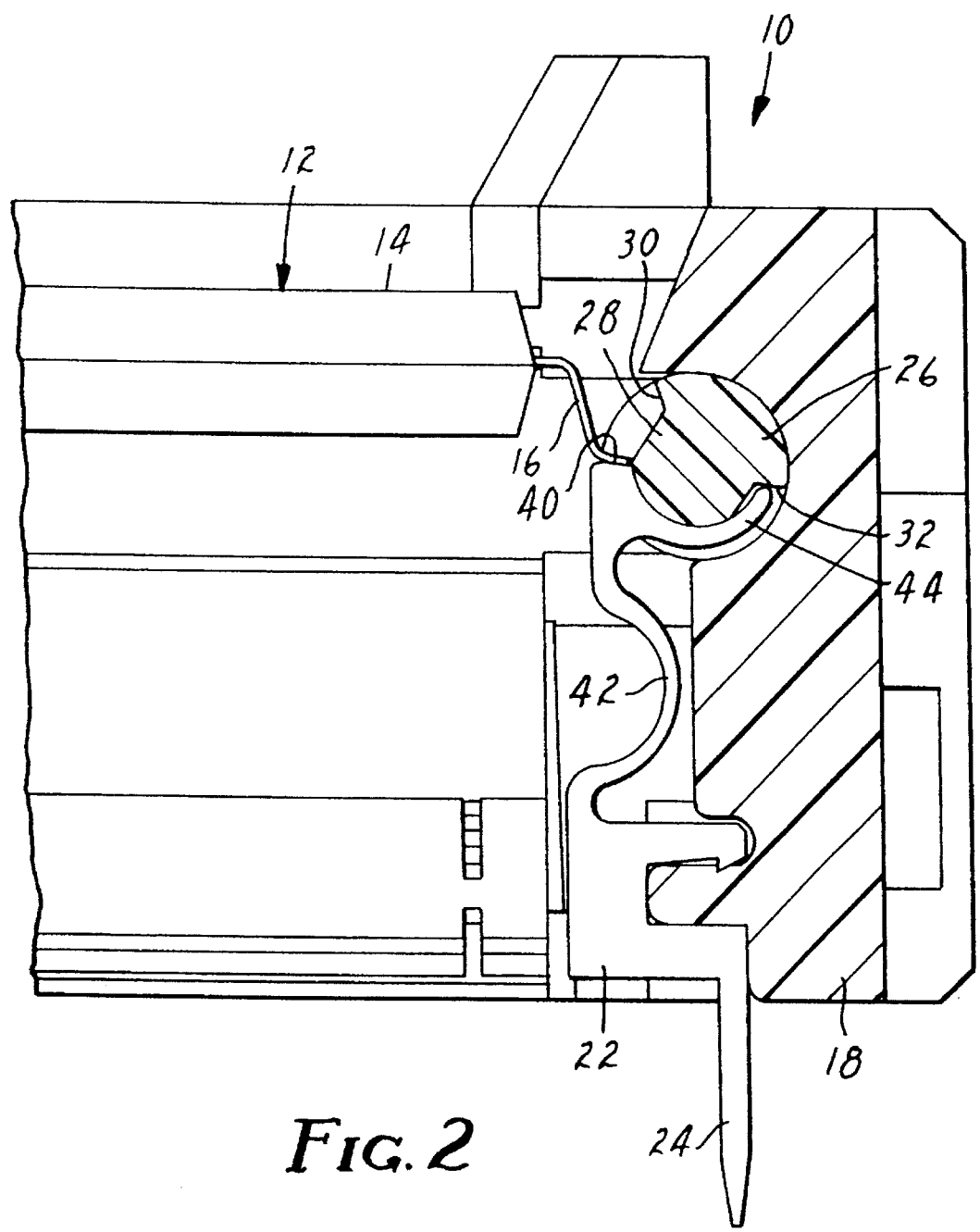
FIG. 2 is a cross-sectional view of a portion of the socket of FIG. 1 with its operating mechanism shown in the open position.
Figure 3:
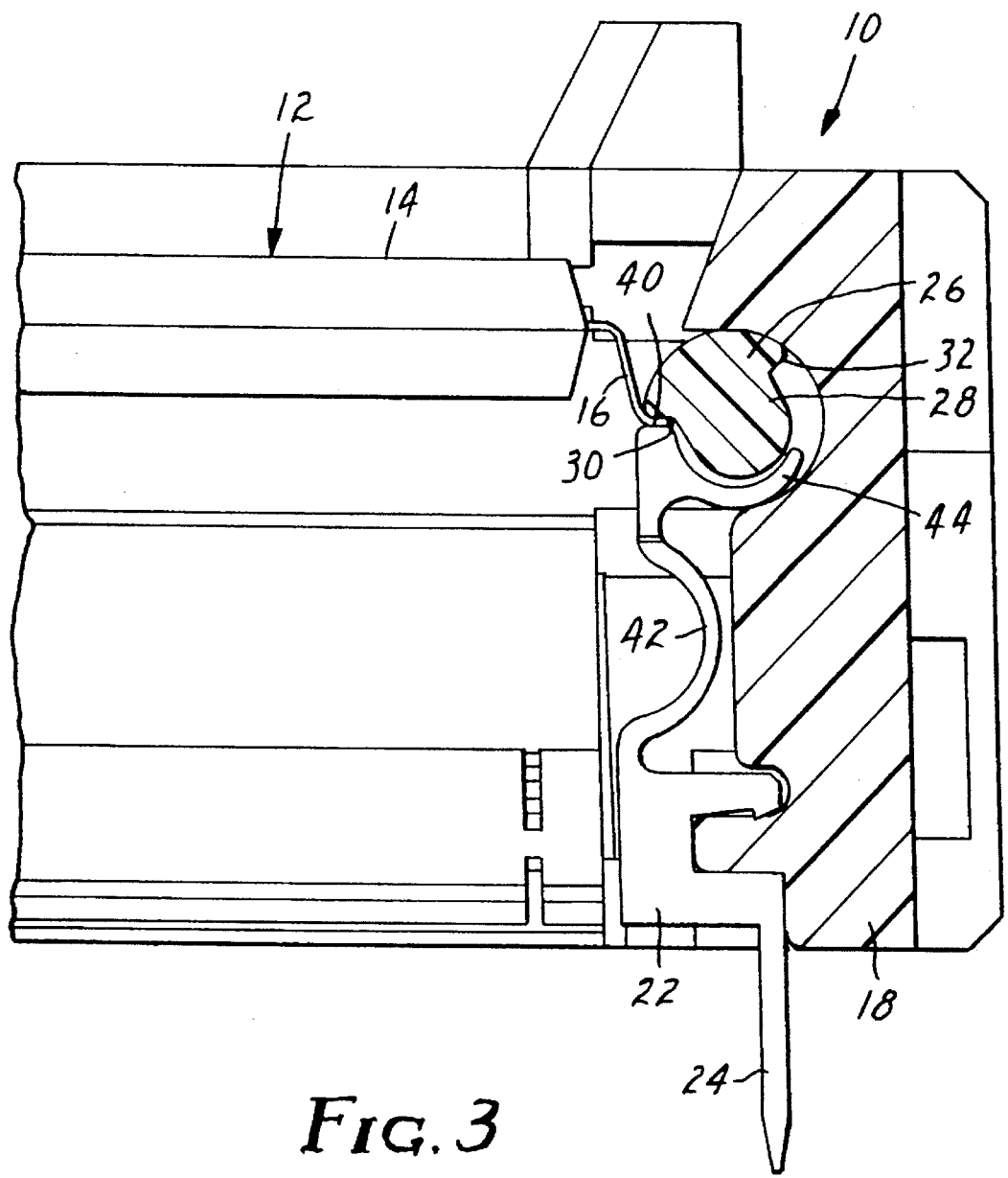
FIG. 3 is a cross-sectional view similar to FIG. 2, but with the operating mechanism in the closed position.

With reference to FIGS. 2 and 3, the contacts 22 include a shoulder 40 which is located such that the leads 16 rest upon this contact shoulder 40 when the device 12 is positioned within the socket 10. When the cams 26 are rotated to the open position, the contact shoulders 40 are exposed by the slots 28 and the device 12 may be inserted into or removed from the socket 10. Once inserted, the cover 20 is depressed and locked, rotating the cams 26 and their slots 28 to the position shown in FIG. 3. When the cam 26 is rotated closed, the flat transition surfaces 30 bear against the leads 16 of the device 12 and force them downwardly against the resiliency of a spring curve 42 formed in the contacts 22. Electrical signals can then be conducted from the leads 16 to a second device through the tails 24 of the contacts 22. The contacts 22 preferably include a curved projection 44 partially surrounding the minor radius of the slot 28 to prevent horizontal movement of the contact shoulder 40 as the cam 26 is rotated to the closed position.

Figure 4:
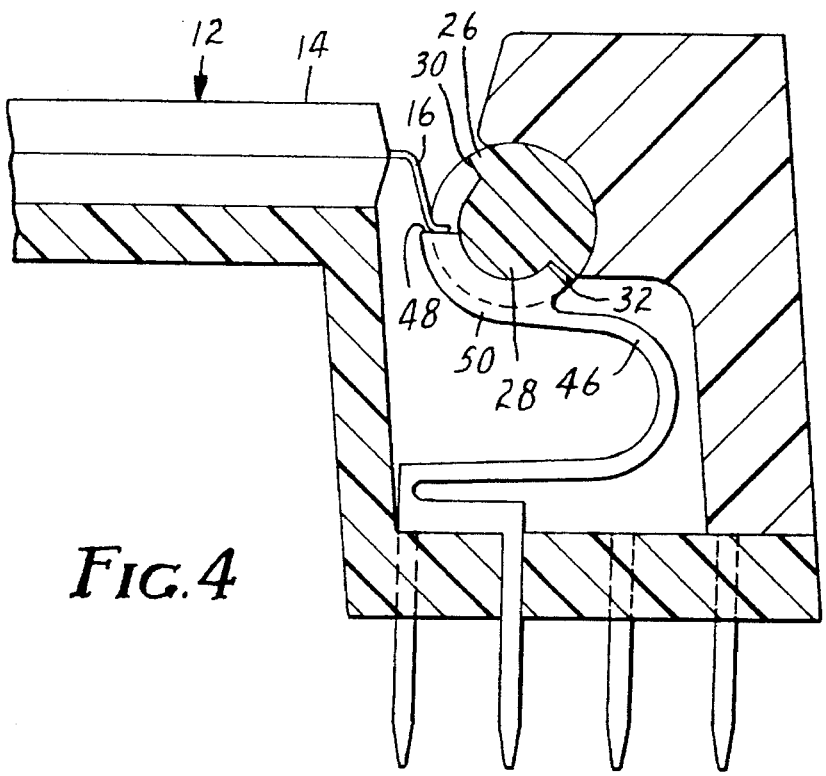
FIG. 4 is a cross-sectional view illustrating a portion of a second embodiment of a socket according to the invention.
Figure 5:
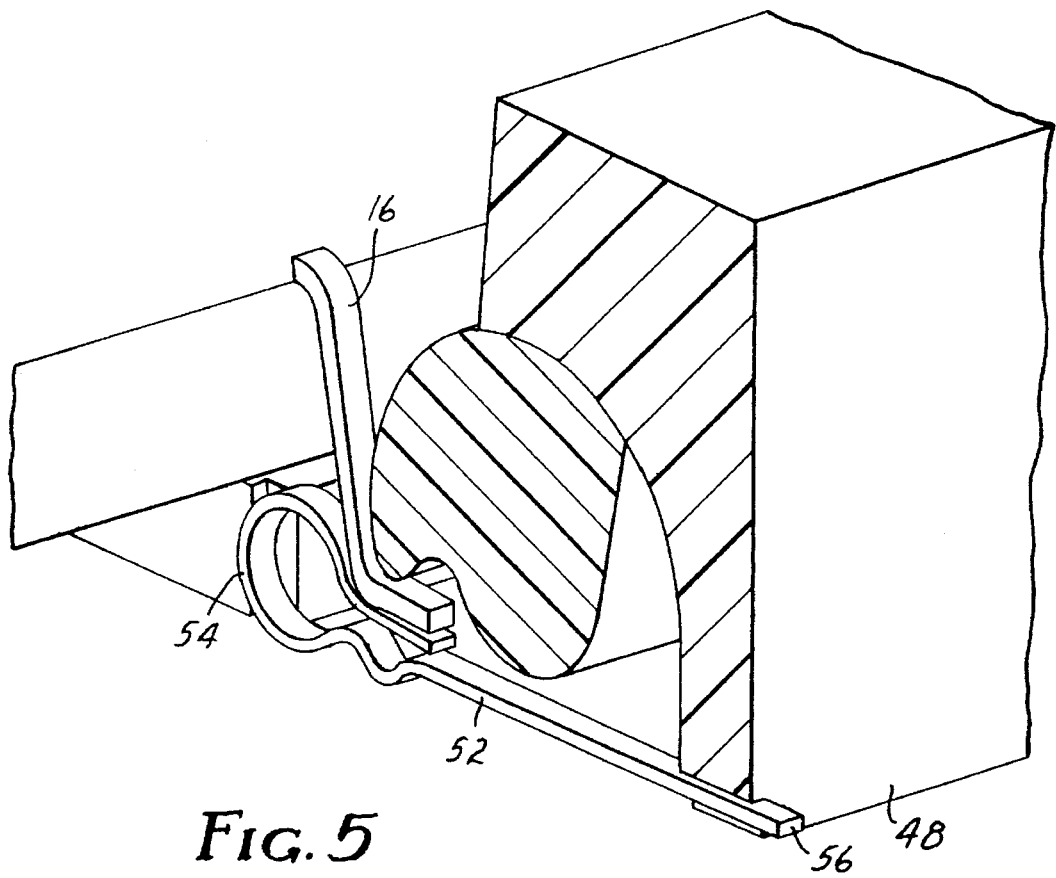
FIG. 5 is a cross-sectional view illustrating a portion of a third embodiment of a socket according to the invention.

FIG. 4 illustrates an alternate embodiment of the invention, wherein the contact 46 is modified such that the contact shoulder 48 is formed at the end of a cantilever arm 50. FIG. 5 illustrates a second alternate embodiment wherein the contact 52 includes a nearly circular spring portion 54 and the tail 56 of the contact 52 exits the side of the body 58 of the socket rather than the bottom.

Thus there has been described a socket adapted to releasably retain a gull wing type electronic device. It will be apparent to those skilled in the art that many modifications to the embodiments described herein are possible. For example, the cam need not be cylindrical for its entire length or at portions of its circumference other than the slot. Also, although the cam is illustrated with a number of individual slots separated by ribs, this arrangement is not necessary and the slots could be replaced by a continuous recess of reduced diameter.

The invention claimed is:

1. A socket for an electronic device of the type having a generally planar encapsulant and leads extending from the encapsulant to terminate at ends disposed below the encapsulate and extending parallel to the plane of the encapsulate, the socket comprising:

a body for receiving the device;

at least one cam supported for rotation relative to said body;

a recess defined by a length of reduced diameter in said cam for receiving the leads of the device;

contacts supported by said body and including a shoulder within said recess for supporting and electrically contacting the leads of the device;

a transition surface extending outwardly from said recess toward an outer surface of said cam for engaging the leads of the device and forcing the leads into contact with said contact shoulders upon rotation of said cam; and means for rotating said cam.

2. A socket according to claim 1 further including ribs spaced along said recess to divide said recess into slots for receiving the leads of the device.

3. A socket according to claim 1 further including a cantilever arm extending from said cam and a cover moveable with respect to said base and interacting with said arm to define said means for rotating said cam.

4. A socket according to claim 1 wherein said contacts further include a curved spring portion to permit resilient deformation of said contact shoulder.

\* \* \* \* \*